(12) United States Patent
Feye-Hohmann

(10) Patent No.: US 9,640,881 B2
(45) Date of Patent: May 2, 2017

(54) CONTACT DEVICE FOR ESTABLISHING AN ELECTRICAL CONNECTION TO A CONTACT POINT OF A PRINTED CIRCUIT BOARD

(71) Applicant: PHOENIX CONTACT GMBH & CO. KG, Blomberg (DE)

(72) Inventor: Juergen Feye-Hohmann, Detmold (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 14/904,702

(22) PCT Filed: Jul. 4, 2014

(86) PCT No.: PCT/EP2014/064305
§ 371 (c)(1),
(2) Date: Jan. 13, 2016

(87) PCT Pub. No.: WO2015/007545
PCT Pub. Date: Jan. 22, 2015

(65) Prior Publication Data
US 2016/0156115 A1  Jun. 2, 2016

(30) Foreign Application Priority Data
Jul. 16, 2013 (DE) ........................ 10 2013 107 508

(51) Int. Cl.
*H01R 13/42* (2006.01)
*H01R 12/58* (2011.01)
(Continued)

(52) U.S. Cl.
CPC .......... *H01R 12/585* (2013.01); *H01R 12/58* (2013.01); *H01R 43/205* (2013.01); *H05K 3/325* (2013.01);
(Continued)

(58) Field of Classification Search
USPC .................................. 439/737, 742, 741, 78
See application file for complete search history.

(56) References Cited

U.S. PATENT DOCUMENTS

| | | | | |
|---|---|---|---|---|
| 3,103,400 A * | 9/1963 | Gaither | ................ | H02G 3/0616 |
| | | | | 411/34 |
| 3,609,653 A * | 9/1971 | Wallo | ........................ | H01R 9/16 |
| | | | | 439/741 |
| 3,922,050 A * | 11/1975 | Lettini | ..................... | H01R 4/64 |
| | | | | 439/109 |
| 4,046,054 A * | 9/1977 | Gulistan | ................... | F16B 5/02 |
| | | | | 411/15 |
| 4,103,134 A | 7/1978 | Urgero | | |
| 8,075,322 B2 * | 12/2011 | Schwettmann | ........ | H01R 11/28 |
| | | | | 439/78 |
| 8,235,735 B2 * | 8/2012 | Oka | ......................... | H01R 4/06 |
| | | | | 29/844 |

(Continued)

FOREIGN PATENT DOCUMENTS

| | | |
|---|---|---|
| EP | 2043202 A1 | 4/2009 |
| EP | 2246939 B1 | 11/2010 |

(Continued)

OTHER PUBLICATIONS

International Search Report of PCT/EP2014/064305, p. 1-3.

*Primary Examiner* — Phuong Dinh
(74) *Attorney, Agent, or Firm* — Leydig, Voit & Mayer, Ltd.

(57) ABSTRACT

A contact device for establishing an electrical connection to a contact point of a printed circuit board is insertable into a contact hole arranged at the contact point, so as to establish an electrical connection to the contact point of the printed circuit board. The contact device includes a contact element having a deformation portion and a screw element operable to be screwed into the contact element. The deformation portion is in a longitudinal extension state when in a pre-assembly state and is operable to be deformed out of the longitudinal extension state when in an assembled state by means of the screw element being screwed at least part way into the contact element.

18 Claims, 3 Drawing Sheets

(51) Int. Cl.
  *H05K 3/32* (2006.01)
  *H01R 43/20* (2006.01)
  *F16B 37/06* (2006.01)
  *H01R 4/06* (2006.01)
  *H01R 4/36* (2006.01)
  *H01R 12/51* (2011.01)
  *H01R 12/53* (2011.01)

(52) U.S. Cl.
  CPC .............. *F16B 37/067* (2013.01); *H01R 4/06* (2013.01); *H01R 4/36* (2013.01); *H01R 12/515* (2013.01); *H01R 12/53* (2013.01); *H05K 2201/1031* (2013.01); *H05K 2201/10409* (2013.01); *Y02P 70/611* (2015.11)

(56) References Cited

U.S. PATENT DOCUMENTS

| | | | |
|---|---|---|---|
| 2002/0159829 A1 | 10/2002 | Kruger et al. | |
| 2009/0088018 A1 | 4/2009 | Nicko | |
| 2010/0279523 A1 | 11/2010 | Schwettmann et al. | |
| 2012/0159829 A1* | 6/2012 | Krutil ...................... | F41A 3/58 42/40 |

FOREIGN PATENT DOCUMENTS

| | | | |
|---|---|---|---|
| JP | 50125795 U | 10/1975 | |
| JP | 5890669 U | 6/1983 | |
| JP | 6163775 U | 4/1986 | |

* cited by examiner

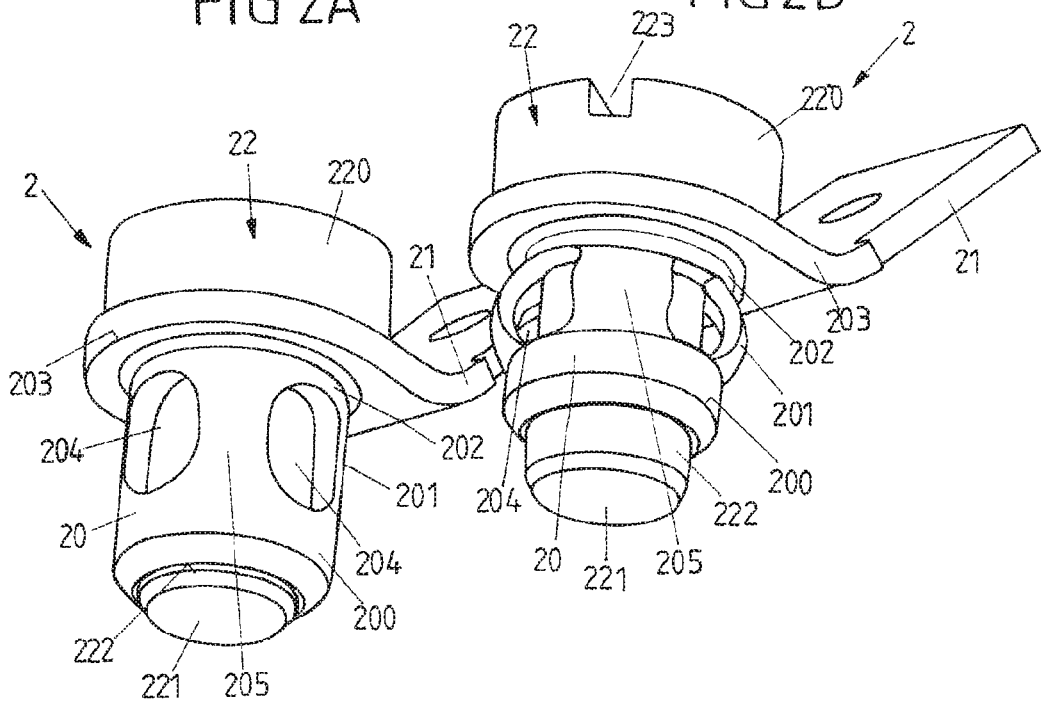
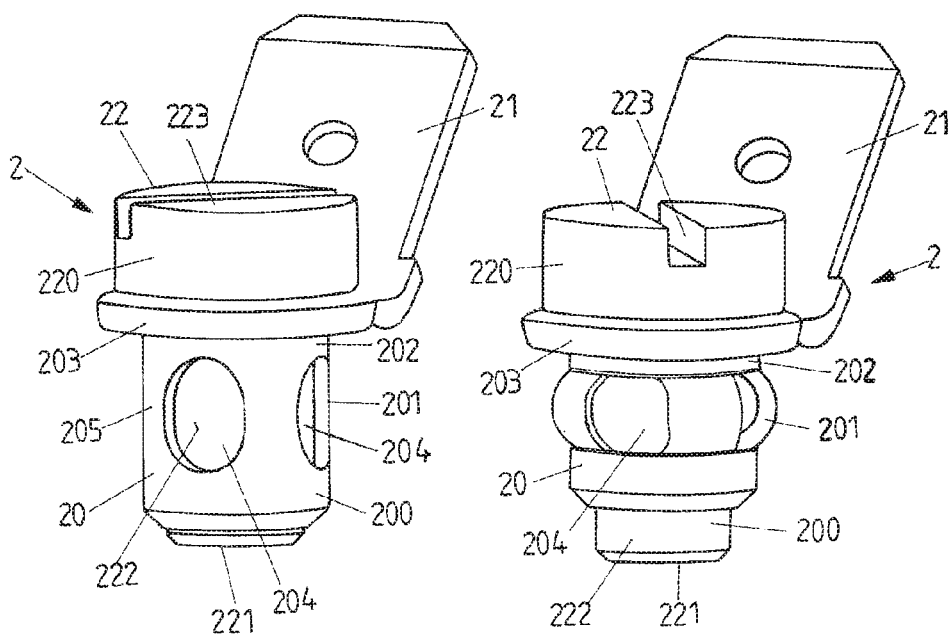

CONTACT DEVICE FOR ESTABLISHING AN ELECTRICAL CONNECTION TO A CONTACT POINT OF A PRINTED CIRCUIT BOARD

CROSS REFERENCE TO RELATED APPLICATIONS

This application is a U.S. National Stage Application under 35 U.S.C. §371 of International Application No. PCT/EP2014/064305 filed on Jul. 4, 2014, and claims benefit to German Patent Application No. DE 10 2013 107 508.8 filed on Jul. 16, 2013. The International Application was published in German on Jan. 22, 2015 as WO 2015/007545 A1 under PCT Article 21(2).

FIELD

The invention relates to a contact device for establishing an electrical connection to a contact point of a printed circuit board, to a printed circuit board arrangement, and to a method for establishing an electrical connection to a printed circuit board. Such a contact device for establishing an electrical connection to a contact point of a printed circuit board can be inserted into a contact hole in the printed circuit board, which contact hole is arranged at the contact point, to establish an electrical connection to the contact point of the printed circuit board.

BACKGROUND

An electrical conductor for example can be connected to the contact point of the printed circuit board by means of a contact device. In this regard, the contact device passes through the contact hole in the contact point and thereby establishes an electrical contact, and therefore an electrical conductor connected to the contact device contacts the contact point of the printed circuit board by means of the contact device.

A contact device which is known from EP 2 246 939 B1 and is referred to as an electrical connection element in said document comprises an electrical contact and a clamping pin and is formed on an aperture in a printed circuit board for removably fastening an electrical conductor. The electrical contact can be inserted into the aperture in the printed circuit board, the contact region being radially widened by inserting the clamping piece into a sleeve-like contact region of the electrical contact and thus being wedged against an inner wall of the aperture. In this way, the electrical contact is contacted with the inner wall of the aperture.

In the case of a plug-in connector known from EP 2 043 202 A1, a connector part having an inner body can be inserted into an associated socket part. In this respect, the connector part and the socket part each comprise a sleeve which is divided into annular segments. The annular segments can be radially bent at the free ends thereof to thus allow the connector part and the socket part to be plugged together in a simple manner.

SUMMARY

In an embodiment, the present invention provides a contact device for establishing an electrical connection to a contact point of a printed circuit board, the contact device being insertable into a contact hole arranged at the contact point, so as to establish an electrical connection to the contact point of the printed circuit board. The contact device includes a contact element having a deformation portion and a screw element operable to be screwed into the contact element. The deformation portion is in a longitudinal extension state when in a pre-assembly state and is operable to be deformed out of the longitudinal extension state when in an assembled state by the screw element being screwed at least part way into the contact element.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 2A is a perspective view of a contact device according to an embodiment of the invention in a pre-assembly state;

FIG. 2B is a perspective view of the contact device according to an embodiment of the invention in an assembled state when the deformation portion is deformed;

FIG. 3A is another perspective view of the contact device according to an embodiment of the invention in the pre-assembly state;

FIG. 3B is another perspective view of the contact device according to an embodiment of the invention in the assembled state;

DETAILED DESCRIPTION

Figure 1:
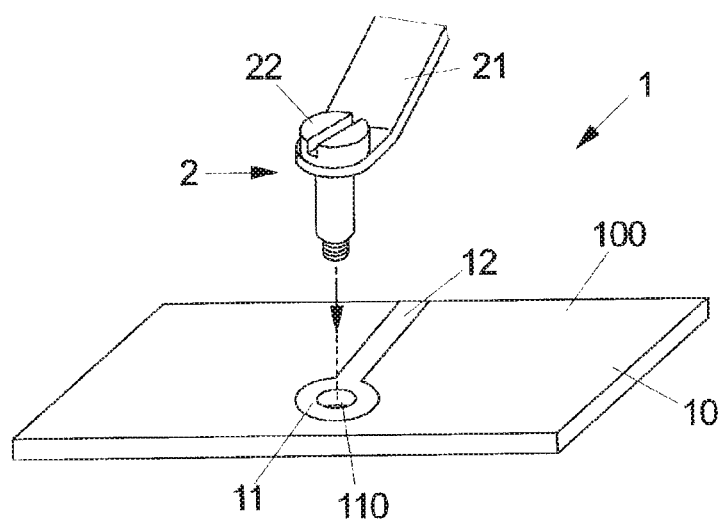
FIG. 1 shows a printed circuit board arrangement according to an embodiment of the invention before a contact device has been attached to a contact point of a printed circuit board.

An embodiment of the present invention provides a contact device, a printed circuit board arrangement, and a method for establishing an electrical connection to a printed circuit board, which allows a contact device to be connected in a simple and cost-effective manner with a secure contacting connection when in an assembled state.

According to an embodiment of the present invention, the contact device comprises a contact element having a deformation portion and a screw element to be screwed into the contact element, the deformation portion being in a longitudinal extension state when in a pre-assembly state and being deformed out of the longitudinal extension state when in an assembled state by means of the screw element that is screwed at least part way into the contact element.

An embodiment of the present invention is based on the idea of providing an expansion dowel-like contact device. For this purpose, the contact device comprises a deformation portion that can be deformed so as to provide a preferably form-fitting connection between the contact element and the printed circuit board when in an assembled state. In an initial state, which corresponds to the longitudinal extension state, the deformation portion is at least largely undeformed and extends for example substantially cylindrically, and therefore the contact element can be inserted, by the deformation portion thereof, into the contact hole in the printed circuit board. By screwing the screw element into the contact element, the deformation portion is then deformed like an expansion dowel, and so the contact element is wedged in the contact hole and in the process establishes an electrical connection by resting against the contact point of the printed circuit board in an electrically contacting manner, in order to connect an electrical conductor to the contact point of the printed circuit board.

In the assembled state, the deformation portion holds the contact element on the contact point in a preferably form-fitting manner. In this respect, the deformation portion can come to rest at least in part on a rear side of the printed circuit board where it can project from the contact hole in the printed circuit boards, while the screw element comprising a head can come to rest on an upper side of the printed circuit board facing away from the deformation portion. The head of the screw element and the deformation portion of the contact element are thus on different sides of the printed circuit board when in the assembled state, and therefore, as a result of the deformation portion engaging in a form-fitting manner behind the printed circuit board in the region of the contact hole, the contact element is held on the printed circuit board in a clamped manner when in the assembled state.

The screw element advantageously comprises a threaded shank which passes through the deformation portion. The screw element thus extends through the deformation portion by its threaded shank, the screw element preferably already being held on the contact element in the pre-assembly state, and it thus being possible for said screw element to be inserted into the contact hole by its deformation portion in order to mount the contact element on the printed circuit board. By screwing the screw element into the contact element, the deformation portion can then be deformed in order to establish a clamped, form-fitting connection between the contact element and the contact point of the printed circuit board in the assembled state by deforming the deformation portion.

In an embodiment, the contact element comprises a shank portion which axially adjoins the deformation portion in the insertion direction and which penetrates the contact hole in the assembled state. In this case, the shank portion is arranged at a first end of the deformation portion, while an annular threaded portion, which is in threaded engagement with the screw element, axially adjoins a second end of the deformation portion that is remote from the shank portion.

In this respect, the screw element engages, by an external thread arranged on its threaded shank, with an internal thread of the annular threaded portion, as early as in the pre-assembly state, and therefore the screw element is already held on the contact element in the pre-assembly state, although in this case the deformation portion is not yet deformed from its initial longitudinally extended state and can therefore be readily inserted into the contact hole in the printed circuit board. In order to transfer the contact element into the assembled state, the screw element can then be screwed into the threaded portion in a screwing direction that is directed around the insertion direction, as a result of which the threaded portion is moved closer to the shank portion of the contact element and thus the deformation portion arranged between the threaded portion and the shank portion in the axial direction is compressed and thus widened radially to the insertion direction. As a result of the deformation portion radially widening, the contact element is wedged in the contact hole in the printed circuit board and in the process comes to rest against the contact point in a contacting manner, in particular against an inner wall of the contact hole, and therefore an electrical connection between the contact element and the contact point of the printed circuit board is established.

The deformation portion is designed such that, by screwing the screw element into the contact element, it is deformed like an expansion dowel so as to establish an electrical connection between the contact element and the printed circuit board. In this case, in order to deform the deformation portion in a predetermined and targeted manner, the wall strength of the deformation portion can for example be lower than that of other portions, in particular the shank portion and threaded portion adjoining the deformation portion, and therefore the deformation portion is weakened in a targeted manner in comparison with the adjacent portions. A lower wall strength, i.e. a reduced rigidity, can for example be achieved by the wall thickness of the deformation portion being lower than that of the adjacent portions. Alternatively, the deformation portion can be made of a material having reduced rigidity, wherein the deformation portion is preferably electrically conductive like the contact element as a whole.

Alternatively or additionally, the deformation portion can also comprise a number of recesses which are circumferentially distributed around the insertion direction and thus weaken some parts of the deformation portion. Providing recesses of this type can make it possible for single portions of the deformation portion to be deformed with respect to one another in order to radially widen the deformation portion when the deformation portion is axially compressed by screwing in the screw element for the transfer into the assembled state, and therefore the deformation portion is deformed in a defined and predetermined manner.

The deformation portion is preferably plastically deformed when transferring from the pre-assembly state into the assembled state. The deformation of the deformation portion is thus irreversible in that the deformation portion substantially retains its shape even after the screw element has been unscrewed. In particular, the deformation portion does not return to its original shape even when the screw element should be unscrewed from the contact element after the assembled state has been established. Therefore, the contact element cannot be removed from the printed circuit board without being damaged, and therefore an electrical connection to the printed circuit board is provided which, in principle, cannot be broken.

The contact element is advantageously made of metal and is also advantageously formed in one piece. The contact element being made of metal results in it being possible for different portions of the contact element, for example the deformation portion, the shank portion and the collar, to electrically contact the inner wall of the contact hole and/or other plated portions of the contact point around the contact hole, and therefore a low-resistance connection between the contact element and the contact point can be established.

The contact device, together with the contact element thereof, can be used to establish an electrical connection to the printed circuit board. An electrical conductor can preferably be connected to the contact point of the printed circuit board by means of the contact device, it being possible for the contact element to for example comprise a plug-in contact for connecting an electrical connector. An electrical wire can be removably connected to the contact element by means of the plug-in contact and an electrical connector to be connected to the plug-in contact, and therefore, by releasing the plug connection, another electrical conductor can be connected to the contact element, or the printed circuit board having the contact element arranged thereon can be replaced.

A printed circuit board arrangement comprises a printed circuit board which comprises at least one contact point and a contact hole arranged at the contact point. In this case, a contact device of the type described above which is to be inserted into the contact hole for establishing an electrical connection to the contact point of the printed circuit board is provided, wherein the deformation portion of the contact device is to be inserted into the contact hole in an insertion direction when in a pre-assembly state and is deformed in an assembled state by the screw element that is screwed at least part way into the contact element in such a way that the contact element is held on the contact point.

In the assembled state, the deformation portion holds the contact element to the contact point in a preferably form-fitting manner. In this case, the screw element can comprise a head which comes to rest on a side of the printed circuit board facing away from the deformation portion when in the assembled state, and therefore the head and the deformation portion hold the printed circuit board therebetween when in the assembled state.

The contact element can further comprise a collar, which, when in the assembled state, rests against the printed circuit board, the collar and the deformation portion coming to rest on different sides of the printed circuit board when in the assembled state. When in the assembled state, the collar, which preferably axially adjoins the shank portion of the contact element, is flat against the contact point, for example on the upper side of the printed circuit board on which conductor tracks of the printed circuit board also extend, while the deformation portion projects from the contact hole on an opposite rear side of the printed circuit board and holds the contact element on the printed circuit board in a clamped and form-fitting manner when in the radially widened deformed state. In the assembled state, the collar and the deformation portion thus enclose the printed circuit board therebetween, and so the printed circuit board is held between the collar and the deformation portion.

A via is preferably arranged on the contact hole of the printed circuit board. The (cylindrical) inner wall of the contact hole is plated by means of the via and is thus electrically conductive, and so the contact element can electrically contact the inner wall of the contact hole.

According to an embodiment, a method is provided for establishing an electrical connection to a printed circuit board. In this case, the printed circuit board comprises at least one contact point and a contact hole arranged at the contact point. A contact device is inserted into the contact hole to establish the electrical connection. In this case, it is provided that the contact device comprises a contact element having a deformation portion and a screw element to be screwed into the contact element. In order to establish the electrical connection, the deformation portion is inserted into the contact hole in an insertion direction, and the screw element is screwed at least part way into the contact element, and therefore the deformation portion is deformed in order to hold the contact element on the contact point.

The advantages and advantageous embodiments of the printed circuit board arrangement as described above are applied in an analogous manner to the method, and therefore reference should be made to the details above.

FIG. 1 is a schematic view of a printed circuit board arrangement 1 which comprises a printed circuit board 10 having a contact point 11 arranged thereon and a conductor track 12 which is connected to the contact point 11. A contact hole 110 is arranged on the contact point 11, which hole provides an aperture through the printed circuit board 10 and can be plated in the region of its inner wall, for example by means of a via 111, as shown by way of example in FIG. 5.

A contact device 2 having a contact element 20 is supposed to be connected to the contact point 11 so as to establish an electrical connection to the contact point 11 of the printed circuit board 10. The contact device 2 comprises a plug-in contact 21 for connecting an electrical conductor, and therefore an electrical conductor can be connected to the contact point 11 by means of the contact device 2 and can thus be attached to the printed circuit board 10 in an electrically contacting manner.

One embodiment of a contact device 2 of this type is shown in different views and states in FIGS. 2A, 2B and 3A, 3B. In this case, FIGS. 2A and 3A show the contact device 2 in a pre-assembly state, in which the contact device 2 can be inserted into the contact hole 110 of the contact point 11 by its contact element 20. On the other hand, FIGS. 2B and 3B show the contact device 2 in an assembled state, which the contact device 2 assumes when the contact device 2 is held on the printed circuit board 10 by its contact element 20.

The contact device 2 consists of a single-piece contact element 20 which is made of a metal material and is formed integrally with the plug-in contact 21, which forms the contact element 20, and a screw element 22 that is to be screwed into the contact element 20 and is used to transfer the contact element 20 from the pre-assembly state (FIG. 2A, 3A) into the assembled state (FIG. 2B, 3B).

The contact element 20 comprises a deformation portion 201, which a threaded portion 200 axially adjoins at one end of the deformation portion 201 and which a shank portion 202 axially adjoins at another end of the deformation portion 201. The shank portion 202 passes into a collar 203 which radially protrudes over the shank portion 202 and is connected integrally to the plug-in contact 21.

The deformation portion 201 comprises recesses 204 which are circumferentially distributed on the substantially cylindrical deformation portion 201 in a longitudinal extension state which corresponds to the pre-assembly state, and are formed between webs 205. Owing to the recesses 204, some parts of the deformation portion 201 are weakened in particular when compared with the annular threaded portion 200 and the annular shank portion 202, and therefore the deformation portion 201 can be deformed in a targeted and defined manner by screwing the screw element 22 into the contact element 20.

The screw element 22 comprises a head 220 and a shank portion 221. The shank portion 221 has an external thread which is in threaded engagement with an internal thread of the threaded portion 200. The head 220 is located on a side of the collar 203 facing away from the threaded portion 200 and comprises a tool engagement means 222, by means of which the screw element 22 can be rotated relative to the contact element 20.

In order to attach the contact device 2 to the printed circuit board 10, the contact element 20 is inserted into the contact hole 110 in an insertion direction E by its deformation portion 201 and by the screw element 22 which is held on the contact element 20. Since the deformation portion 201 extends substantially cylindrically when in the pre-assembly state, the contact element 20 can be readily inserted into the contact hole 110 by its deformation portion 201, wherein the collar 203 and the head 220 of the screw element 22 come to rest on an upper side 100 of the printed circuit board 10 on which the conductor track 12 also extends.

After inserting the contact element 20 into the contact hole 110, the screw element 22 is screwed into the contact element 20 in a screwing direction V to fasten the contact element 20 to the printed circuit board 10. As a result, the threaded portion 200 which is in threaded engagement with the thread 222 of the threaded shank 221 is moved closer to the shank region 202 and to the collar 203, and therefore the deformation portion 201 located between the threaded portion 200 and the shank portion 201 is axially compressed in the insertion direction E and, as a result, the webs formed between the recesses 204 bend outwards. In this manner, the deformation portion 201 is radially widened, as shown in FIGS. 2B and 3B.

Figure 4:
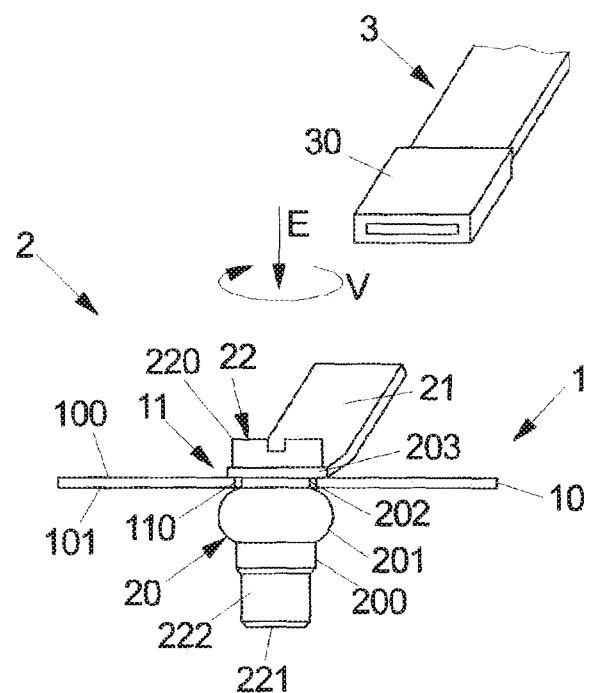
FIG. 4 is a schematic view of the contact device according to an embodiment of the invention in the assembled state on a printed circuit board.

FIG. 4 is a schematic view of the contact device 2 arranged on the printed circuit board 10 in its assembled state. In the assembled state, the shank portion 202 of the contact element 20 passes through the contact hole 110 in the printed circuit board 10, the collar 203 and the deformation portion 201 coming to rest on different sides 100, 101 of the printed circuit board 10 and thus holding the printed circuit board 10 therebetween. Since the deformation portion 201 is radially widened, the contact element 20 is held on the contact point 11 of the printed circuit board 10 in a clamped manner, electrical contact being established by the collar 203 being flat against the top of the contact point 11 and by the shank portion 202 and the deformation portion 201 resting against the inner wall of the contact hole. This results in a fixed, low-resistance connection between the contact element 20 and the contact point 11 of the printed circuit board 10.

The deformation of the deformation portion 201 is preferably plastic deformation. The deformation is thus permanent and does not reverse even when the screw element 22 is unscrewed from the contact element 20 following assembly. The connection between the contact element 20 and the printed circuit board 10 thus cannot be broken without causing damage, wherein, in order to secure the connection, the screw element 22 preferably also remains in the contact element 20 once the assembled state has been established.

An electrical connection to the contact point 11 of the printed circuit board 10 is established by means of the contact device 2. By mounting an electrical connector 30 of an electrical wire 3, the electrical wire 3 can be removably connected to the contact device 2, wherein, in order to connect another electrical wire 3 or in order to replace the printed circuit board arrangement 1 having the contact device 2 arranged thereon, the connection between the plug-in contact 21 and the electrical connector 30 can be broken.

Figure 5:
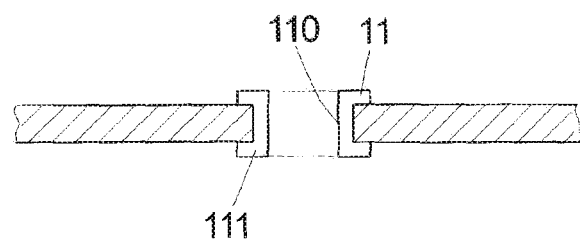
FIG. 5 is a schematic sectional view of a printed circuit board according to an embodiment of the invention in the region of a contact point, comprising a via arranged on a contact hole.

FIG. 5 schematically shows a via 11 arranged on the contact hole 110, which via engages through the contact hole 110 and thus provides a metal inner wall of the contact hole 110. A reliable, low-resistance electrical connection between the contact device 2 and the contact point 11 is established by means of a via 111 of this type.

The invention is not limited to the embodiments described above, but can also in principle be implemented in completely different embodiments.

In principle, any number of contact devices of the type described here can be attached to a printed circuit board, it also being conceivable to combine a plurality of contact devices with one another so that a contact element comprises for example two or more deformation portions into which two or more screw elements can be screwed.

A contact device of the described type can be used to connect completely different electrical conductors or electrical devices to a printed circuit board. In this context, a printed circuit board is to be understood as any support element which comprises a contact point for electrically contacting a contact device. In particular, the printed circuit board does not necessarily extend in one plane.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1 Printed circuit board arrangement
10 Printed circuit board
100, 101 Sides
11 Contact point
110 Contact hole
12 Conductor track
2 Contact device
20 Contact element
200 Threaded portion
201 Deformation portion
202 Shank portion
203 Collar
204 Recesses
205 Webs
21 Plug-in contact
22 Screw element
220 Head
221 Threaded shank
222 Thread
223 Tool engagement means
3 Electrical wire
30 Connector
E Insertion direction
V Screwing direction

The invention claimed is:
1. A contact device for establishing an electrical connection to a contact point of a printed circuit board, the contact device being insertable into a contact hole arranged at the contact point, so as to establish an electrical connection to the contact point of the printed circuit board, the contact device comprising:
a contact element having a deformation portion and a screw element operable to be screwed into the contact element,
wherein the deformation portion is in a longitudinal extension state when in a pre-assembly state and is operable to be deformed out of the longitudinal extension state when in an assembled state by the screw element being screwed at least part way into the contact element.

2. The contact device according to claim 1, wherein that the screw element comprises a threaded shank that passes through the deformation portion.

3. The contact device according to claim 1, wherein, when in the pre-assembly state, the contact element extends in an insertion direction by its deformation portion, which is in the longitudinal extension state.

4. The contact device according to claim 3, wherein the contact element has a shank portion which axially adjoins the deformation portion in the insertion direction and which is operable to pass through the contact hole in the assembled state.

5. The contact device according to claim 4, wherein the contact element comprises a threaded portion which axially adjoins an end of the deformation portion remote from the shank portion, and which is in threaded engagement with the screw element.

6. The contact device according to claim 5, wherein the screw element is in threaded engagement with the threaded portion in the pre-assembly state and is operable to be screwed into the threaded portion in a screwing direction directed around the insertion direction in order to transfer the contact element into the assembled state.

7. The contact device according to claim 5, wherein, in the assembled state, the threaded portion is closer to the shank portion than when in the pre-assembly state.

8. The contact device according to claim 1, wherein the deformation portion has a wall strength that is lower than that of at least one axially adjacent portion of the contact element.

9. The contact device according to claim 1, wherein the deformation of the deformation portion from the pre-assembly state to the assembled state is plastic deformation.

10. The contact device according to claim 1 wherein the contact element is made of metal.

11. The contact device according to claim 1, wherein the contact element comprises a plug-in contact for connecting an electrical connector.

12. A printed circuit board arrangement comprising:
a printed circuit board having at least one contact point and a contact hole arranged at the contact point; and
a contact device having a deformation portion and a screw element operable to be screwed into the contact element, wherein the deformation portion is in a longitudinal extension state when in a pre-assembly state,
wherein the contact device is operable to be inserted into the contact hole to establish an electrical connection to the at least one contact point of the printed circuit board,
wherein the deformation portion of the contact device is operable to be inserted into the contact hole in an insertion direction when in the pre-assembly state, and
wherein the deformation portion is operable to be deformed in the assembled state by the screw element being screwed at least part way into the contact element in such a way that the contact element is held on the contact point.

13. The printed circuit board arrangement according to claim 12, wherein the deformation portion is operable to hold the contact element on the contact point in a form-fitting manner when in the assembled state.

14. The printed circuit board arrangement according to claim 12, wherein the screw element comprises a head which, when in the assembled state, comes to rest on one of the sides of the printed circuit board facing away from the deformation portion.

15. The printed circuit board arrangement according to claim 12, wherein the contact element comprises a collar which, when in the assembled state, rests against the printed circuit board, the collar and the deformation portion coming to rest on different sides of the printed circuit board when in the assembled state.

16. The printed circuit board arrangement according to claim 12 further comprising a via arranged on the contact hole.

17. A method for establishing an electrical connection between a printed circuit board and a contact device, the printed circuit board comprising a contact point and a contact hole arranged at the contact point the method comprising:
inserting a deformation portion of a contact element of the contact device into the contact hole in an insertion direction; and
screwing, a screw element of the contact element of the contact device at least part way into the contact element so that the deformation portion is deformed so as to hold the contact element on the contact point.

18. The contact device according to claim 1, wherein the deformation portion comprises recesses which are circumferentially distributed around the insertion direction.

* * * * *